United States Patent [19]
Atkinson et al.

[11] Patent Number: 4,947,141
[45] Date of Patent: Aug. 7, 1990

[54] OSCILLATOR NETWORK FOR RADIO RECEIVER

[75] Inventors: Simon Atkinson, Kent; Francis Carr, Wiltshire, both of United Kingdom

[73] Assignee: Plessey Overseas Limited, Ilford, England

[21] Appl. No.: 335,087
[22] PCT Filed: Jul. 18, 1988
[86] PCT No.: PCT/GB88/00574
  § 371 Date: May 17, 1989
  § 102(e) Date: May 17, 1989
[87] PCT Pub. No.: WO89/00791
  PCT Pub. Date: Jan. 26, 1989

[30] Foreign Application Priority Data
  Jul. 17, 1987 [GB] United Kingdom ............... 8716884

[51] Int. Cl.⁵ .............................................. H03B 5/24
[52] U.S. Cl. ..................... 331/135; 333/215; 331/108 B
[58] Field of Search ............... 331/108 B, 135; 333/24.1, 214, 215

[56] References Cited
U.S. PATENT DOCUMENTS 3,539,943 11/1970 Sheahan ............................ 331/108
4,091,340 5/1978 Greaves et al. ................. 333/214 X
4,193,033 3/1980 Voorman ............................ 375/88
4,462,107 7/1984 Vance .................................. 375/88
4,672,640 6/1987 Meek et al. ........................ 375/120
4,716,579 12/1987 Masterton .......................... 375/81
4,812,785 3/1989 Pauker ............................ 333/215 X FOREIGN PATENT DOCUMENTS
2180419 3/1987 United Kingdom .

Primary Examiner—Robert J. Pascal
Attorney, Agent, or Firm—Fleit, Jacobson, Cohn, Price, Holman & Stern

[57] ABSTRACT

A sinewave oscillator and a quadrature phase shift network fabricated as an integrated circuit for a Barber radio receiver comprising, in order that the network and oscillator be simply adjustable to provide an accurate 90° shift and a sinewave of accurate frequency and high spectral purity, a first capacitance means (C1, C2; C4, C5) coupled to the input of a gyrator (G1; G2) comprising first and second amplifiers (10, 12; 22, 24) connected in feedback configuration with a capacitance (C3; C6) connected to the output of the first amplifier. The oscillator network may be adjusted by current control of transconductance of the amplifiers, and the amplifiers include input signal limiting means to limit the input signal to a linear operating region. An output load resistance (R) may be simulated using a further amplifier connected in feedback configuration.

5 Claims, 4 Drawing Sheets

OSCILLATOR NETWORK FOR RADIO RECEIVER

BACKGROUND OF THE INVENTION

1. Field of the Invention

This invention relates to electrical circuits for use in radio receivers fabricated as integrated circuits.

2. Description of Related Art

There has recently been proposed communication networks known as radio paging networks which will operate over a large area, eventually world-wide, and which transmit digital radio paging information to individual network subscribers on a time-slot basis on a subcarrier of local VHF stereo FM entertainment broadcast channels. With a pilot carrier of 19 KHz and stereo bands entending from 0–53 KHz, the subcarrier has a band width of 9.5 KHz centered at 66.5 KHz.

The subcarrier is received by a subscribers receiver, which may be incorporated in a wrist-watch as an integrated circuit. The type of receiver employed is a Barber receiver which has a principal advantage of high image rejection. The Barber receiver configuration as shown in FIG. 1 comprises an aerial 2, for receiving an incoming signal having a carrier frequency fc, coupled to an AGC controlled preamplifier 4. The incoming signal is then fed to two arms 6, 8 where it is mixed in mixers 10. 12 with signals, in phase quadrature with one another, from a local oscillator 14. The frequency of the local oscillator is identical with the carrier frequency fc. The mixed signals in the two arms are fed via coupling capacitors to low-pass filters 16, 18, and amplifiers 20. 22 to further mixers 24, 26 where the signals are mixed with signals, in phase quadrature with one another from an intermediate frequency oscillator 28. The signals in arms 6, 8, now raised in frequency by the $i_f$ frequency are summated at 30, limited in amplitude by a limiting amplifier 32, and then demodulated by a detector 34 to yield the digital paging signal.

The principal advantage of such a receiver is that of image rejection, since the carrier and local oscillator frequencies are identical and result in a spectrum folded about a base DC level. Further advantages are that the receiver is suitable for integration, having a low enternal component count, and on-chip filtering is possible, since the selectivity is defined at a low frequency.

A principal disadvantage is that the receiver is highly sensitive to phase or gain imbalances in the arms 6, 8 and it is therefore important that the signal provided by the local oscillator and intermediate frequency oscillator are accurately in phase quadrature, to within 1°. Further it is important that the local oscillator and the intermediate frequency oscillator produce signals of accurately defined frequency and high spectral purity. Finally it is normally necessary to track the frequency of the intermediate frequency oscillator with the cut-off frequency of the low-pass filters in the arms, and it is necessary to maintain the phase quadrature relationship while the frequency is varied.

So far as concerns the problem of providing signals which are accurately in phase quadrature, there are many types of networks which will provide a 90° phase shift, for example R-C phase shift networks or networks employing inductances. However problems raise when such networks are incorporated in an integrated circuit. With R-C networks there are large tolerances in the values of the integrated capacitors and it is therefore very difficult to preset the network and obtain an accurate phase shift. With inductive networks, inductances are difficult to fabricate in an integrated circuit and are difficult to preset in value.

SUMMARY OF THE INVENTION

It is an object of the present invention to provide a quadrature network which provides an accurately defined 90° phase shift and which can be fabricated as an integrated circuit without difficulty.

In a first aspect, the present invention provides a quadrature network fabricated as an integrated circuit and comprising a first capacitive means coupled to a gyrator, the gyrator comprising a first amplifier whose output is coupled to a second capacitive means and to the input of a second amplifier whose output is coupled in a feedback loop to the input of the first amplifier, the arrangement being such that a signal applied at a predetermined frequency to the input of the quadrature network is shifted in phase by 90° at the output of the quadrature network.

By providing a gyrator with first and second amplifiers, it is possible to easily adjust the parameters of the gyrator by adjustment of transconductance control current of the amplifiers and thereby compensate for variations in capacitance values without the necessity for further processing operations, such as capacitor trimming, on the integrated circuit. Thus an accurately defined phase shift of 90° may be obtained at a predetermined frequency. Further in accordance with the invention, it is unnecessary to fabricate circuit elements such as inductances which do not lead themselves simply to integration.

The amplifiers employed preferably include emitter coupled bipolar transistors. One problem with such amplifiers is that there is a very limited input signal range, about 60 mV, in which the output signal is linearly related to the input signal and in which the gyrator will function accurately. It is therefore necessary to provide signal limiting means in order to limit the input signals to the amplifier to the linear regions.

So far as concerns the problem of providing a sinewave oscillator whose frequency may accurately be determined and which provides a signal of high spectral purity and which may be fabricated as an integrated circuit, there are two common types of sinewave oscillators which may be mentioned, namely phase shift oscillators and oscillators employing an inductive-capactive reactive network in a feedback loop.

The problem with phase shift oscillators in integrated circuits is that the frequency is not accurately controllable since the capacitance values employed vary within wide limits and it is necessary to perform trimming operations to obtain predictable frequency values. The problem with inductive-capacitive networks in sinewave oscillators in integrated circuits is that inductors are difficult to fabricate on chip and even more difficult to adjust in value.

In order to meet this porblem, the present invention provides, in a second aspect, the sinewave oscillator circuit fabricated as an integrated circuit, the oscillator comprising a main amplifier having its output coupled to its input in a feedback loop which includes a reactive network providing a required phase shift to sustain oscillations, the reactive network comprising a first capacitive means and a gyrator, the gyrator comprising a first amplifier whose output is coupled to a second capacitive means and to the input of a second amplifier whose output is coupled in a feedback loop to the input of the first amplifier.

Thus in accordance with the invention, by the provision of a gyrator as part of the reactive network providing a required phase shift and the gyrator including first and second amplifiers, it is possible simply to adjust the frequency of oscillation by adjustment of the gyrator impedance, preferably by adjustment of the transconductance of the amplifiers. Thus it is possible to adjust the gyrator impedance simply in order to vary the frequency of the oscillator to compensate for variations in capacitance value. Further, the gyrator impedance may be defined to within close limits in order to provide an oscillator signal of high spectral purity. All of the components of the oscillator circuit may be simply integrated.

One problem which arises is that it is necessary for the main amplifier to operate in a non-linear region so that it will saturate in order to limit the amplitude of the oscillations. However, the amplifers employed in the gyrator must operate in a linear region in order to ensure an accurately predictable gyrator impedance. The type of amplifier preferably employed in the gyrator comprises emitter coupled bipolar transistors which may have a linear operating region for a small as 60 mV input voltage. It is therefore necessary to include further amplifying stages and regulate the gain in the various parts of the oscillator circuit to ensure that voltage signals of an appropriate magnitude are applied to the amplifiers of the circuit.

So far as concerns the problem of maintaining an accurately defined quadrature phase shift during variation of oscillator frequency, naturally the problems arise which have been mentioned above with regard to the first and second aspects of the invention. In addition it is necessary to provide a simple and accurate method of adjusting a phase shift network with adjustment of the oscillator frequency. This may be achieved by using the quadrature network according to the first aspect of the invention in combination with the oscillator according to the second aspect of the invention and ganging together the transconductance control inputs of the gyrator amplifiers.

Thus the present invention provides, in a third aspect, an electrical circuit comprising an oscillator coupled to a quadrature phase shift network, the oscillator including a main amplifier having a feed back loop including a reactive network, the reactive network including a first capactive means and a first gyrator, the first gyrator comprising a first amplifier whose output is coupled to a second capacitive means and to the input of a second amplifier whose output is coupled in a feedback loop to the input of the first amplifier, and the quadrature network including a third capacitive means coupled to a second gyrator, the second gyrator comprising a third amplifier whose output is coupled to a fourth capacitive means and to the input of a fourth amplifier whose output is coupled in a feedback loop to the input of the third amplifier, the arrangement being such that a signal applied at a predetermined frequency to the input of the quadrature network is shifted in phase by 90° at the output of the quadrature network and each of said first, second, third and fourth amplifiers including means for controlling the transconductance of the amplifier, said controlling means being ganged together whereby to vary the frequency of the oscillator while maintaining a phase shift of 90° from the quadrature network at the oscillator frequency.

Thus the electrical circuit according to the present invention provides a simple and convenient method of providing signals accurately maintained in phase quadrature, at a precisely defined frequency over a range of frequencies.

BRIEF DESCRIPTION OF THE DRAWINGS

A preferred embodiment of the invention will now be described with reference to the accompanying drawings, wherein.

BRIEF DESCRIPTION OF THE PREFERRED EMBODIMENT

Figure 1:
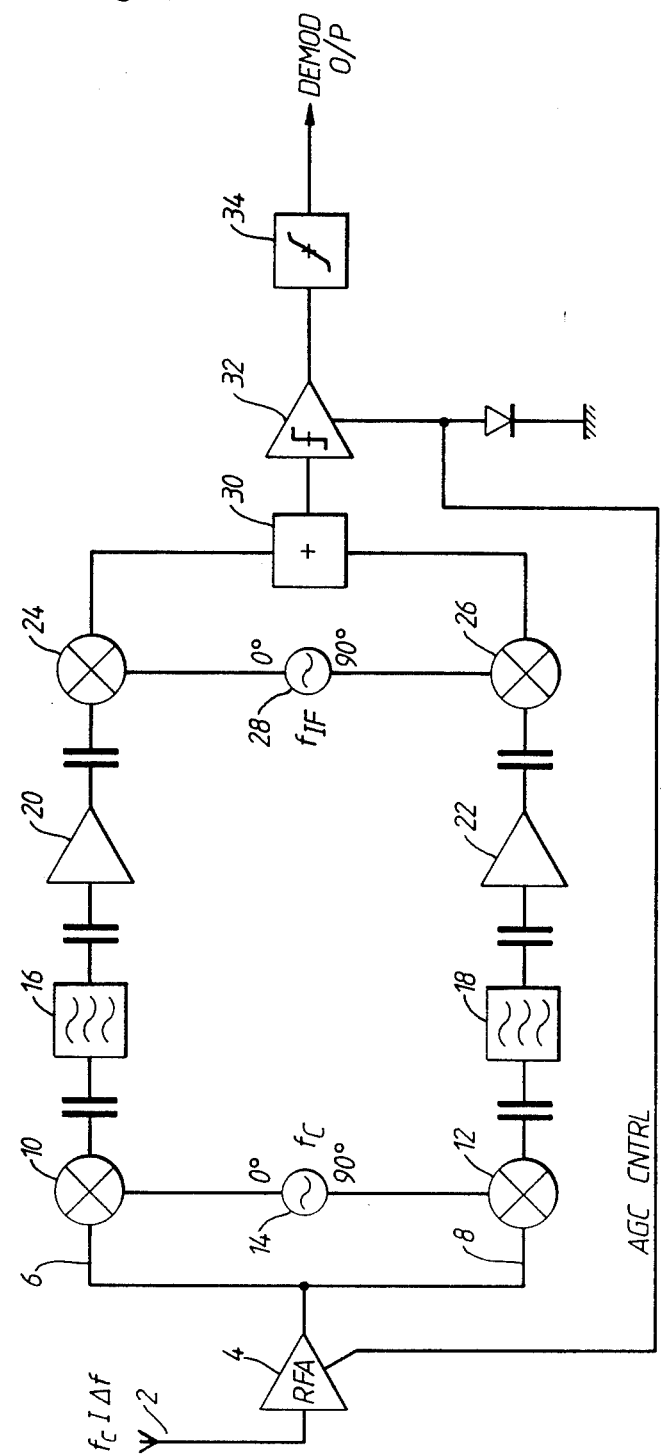
FIG. 1 is a circuit diagram of a Barber Receiver in which the present invention may be incorporated.
Figure 2:
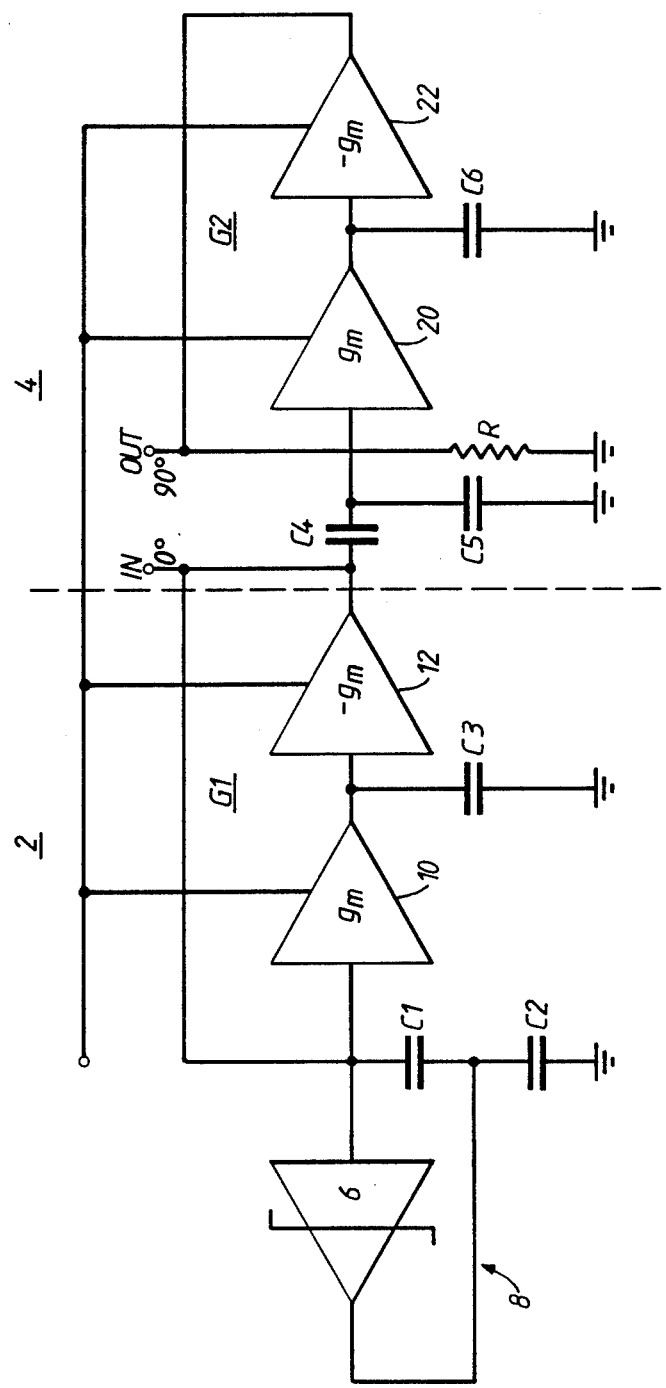
FIG. 2 is a schematic circuit diagram of the preferred embodiment of an electrical circuit according to the invention.

Referring now to the drawings, FIG. 2 shows an electrical circuit comprising an oscillator section 2 and a quadrature phase shift network 4.

Oscillator section 2 is based on the standard Colpitts configuration and comprises a main amplifier 6 having its output connected to its input in a positive feedback loop 8, the feedback loop including a reactive network comprising series coupled capacitors C1, C2 connected between ground and the input to amplifier 6 and a gyator G1 connected across capacitors C1, C2. Gyrator G1 comprises amplifiers 10, 12 with amplifier 10 being a non-inverting amplifier whose output is connected to one plate of a capacitor C3 whose other plate is connected to ground and whose output is connected to the input of amplifier 12, which provides an inverted output, the inverted output being fed back to the input of amplifier 10 thereby to provide a gyrator configuration.

Quadrature phase shift network 4 comprises input and output ports In and Out. A capacitive network coupled to the input port comprises a series connected capacitance C4 and a capacitance C5 connected to earth. An output signal is developed across a load resistance R connected in parallel with capacitance C5. A gyrator G2 is connected to the output port node and comprises a first non-inverting amplifier 20 having a mutual conductance $+g_m$ with its output connected to one plate of a capacitance C6, the other plate of capacitance C6 being connected to ground. The output of amplifier 20 is also connected to the input of a second inverting amplifier 22 having a mutual conductance $-g_m$, the output of amplifier 4 being connected in a feedback loop to the input of amplifier 2.

It may be shown that for an input signal of frequency $\omega$, the impedance Z of the gyrator means is given by: $Z = j\omega C6/g_m^2$.

Figure 4:
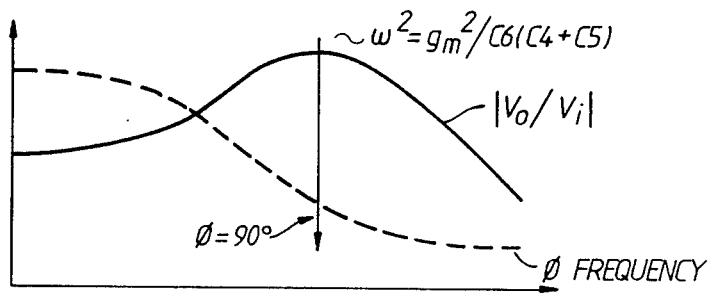
FIG. 4 is a graph indicating phase shift signal and signal gain as a function of frequency for the quadrature network.

Further as may be seen from the graph of FIG. 4, there is a resonance in the signal gain $|V_o/V_i|$ at a frequency $\omega$, where:

$$\omega^2 = [g_m{}^2/C6(C4+C5)]^{-1}$$

At this resonance frequency there is a phase shift $\phi$ between the signals at the input and output ports of 90°.

Thus it may be seen by controlling the transconductance of the amplifiers by suitable adjustment of a control current, it is possible accurately to preset the parameteres of the quadrature network, even where the network is fabricated as an integrated circuit with consequent wide variations in the values of the capacitors.

Figure 3:
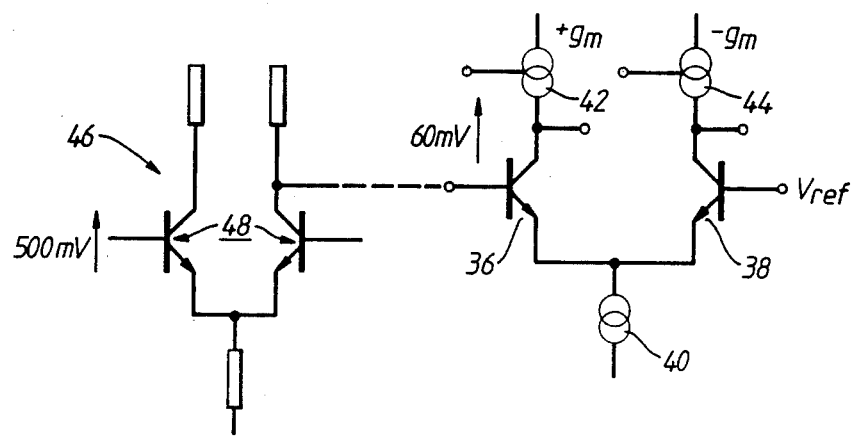
FIG. 3 is a more detailed circuit diagram of the internal construction of each of the gyrator amplifiers of FIG. 2.

An amplifier circuit shown in more detail in FIG. 3, comprises a pair of emitter coupled bipolar transistors 36, 38 coupled by a constant current source 40 and having constant current collector loads 42, 44. The output from transistor 36 provides a positive transconductance whereas the output from transistor 38 provides negative transconductance. Adjustment of the operating parameters may be obtained by adjustment of the current in the collector loads, thereby adjusting the transconductance. With such an amplifier there is a range of about 60mV in which there is a linear relation between input and output. It is therefore necessary to limit the input signal to within this range and a suitable circuit is shown as at 46 comprising a pair of transistors 48 connected in differential configuration to recieve an input signal in the range of about 500mV and providing an output signal within the range 60mV.

Figure 5:
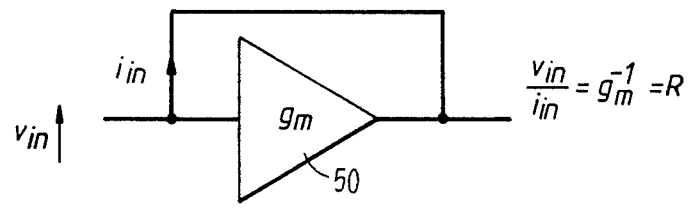
FIG. 5 is a circuit diagram of a modification of the phase quadrature section of FIG. 2.

In a modification shown in FIG. 5, the output load resistance R is stimulated by a further amplifier 50 of similar type to amplifiers 20, 22. The output of the amplifier is connected in a feedback loop to the input and it may be shown the resistance is given by $$\frac{V_{in}}{i_{in}} = g_m{}^{-1} = R.$$

Thus by adjustment of the current controlling the transconductance, the effective load resistance may be adjusted without the need for trimming a fabricated resistance of the integrated circuit.

Figure 6:
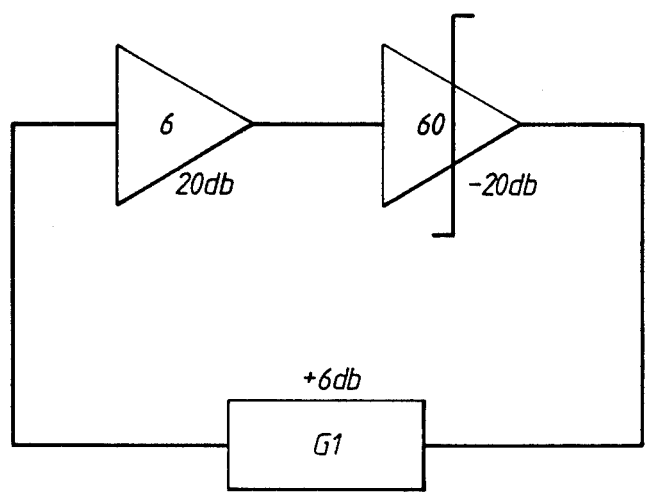
FIG. 6 is a schematic circuit diagram of the oscillator section of FIG. 2, showing gain factors of the amplifying stages.

Referring now to the oscillator section 2 shown in FIG. 2 and in more detail in FIG. 6, since the oscillator is in the standard Colpitts configuration, the frequency $f_{osc}$ of oscillation is given by:

$$f_{osc} = g_m \left( 2\pi \sqrt{\left(\frac{C_1 \cdot C_2}{C_1 + C_2}\right) \cdot C3} \right)^{-1}$$

Oscillator stability and noise performance are directly affected by the Q of the circuit, which is determined in part by the impedance of the quadrature network 4.

It may be shown that in order for network 4 of FIG. 2 to provide a quadrature output at the frequency of oscillation:

$$\frac{C_1 C_2}{C_1 + C_2} = C3 + C4.$$

Referring now to FIG. 6, the oscillator section 2 has a main amplifier 6 with a gain of 20db. Whilst the gyrator G1 has, as explained with reference to FIG. 3, a loss factor, resulting from the use of limiting circuit 46 to limit the value of input voltage applied to transistors 36, 38 to 60mV, nevertheless it exhibits an overall gain of say 6db at resonance resulting from the Q factor of the circuit. Thus in order to provide an oscillatory circuit, it is necessary to provide a signal limiting amplifier 60 having a loss factor of say −20db, in order to provide the correct gain within the circuit. Thus the overall gain in the circuit is +6db, and this small factor ensures the circuit will always oscillate, the excess gain ensuring that amplifier 6 is drawn hard into its non-linear regions.

Although the oscillator network and quadrature phase shift network have been described specifically with respect to use in combination in a Barber receiver, it will be understod that they may be used singly or in combination in any type of electrical circuit for which their characteristics are suitable, and the scope of the invention is limited only by the appended claims.

We claim:

1. A sinewave oscillator circuit fabricated as an integrated circuit, the oscillator comprising a main amplifier having its output coupled to its input in a feedback loop which includes a reactive network providing a required phase shift to sustain oscillations, the reactive network comprising a first capacitive means and a gyrator, the gyrator comprising a first amplifier whose output is coupled to a second capacitive means and to the input of a second amplifier amplifier. whose output is coupled in a feedback loop to the input of the first amplifier.

2. An electrical circuit comprising an oscillator coupled to a quadrature phase shift network, the oscillator including a main amplifier having a feedback loop including a reactive network, the reactive network including a first capacitive means and a first gyrator, the first gyrator comprising a first amplifier whose output is coupled to a second capacitive means and to the input of a second amplifier whose output is coupled in a feedback loop to the input of the first amplifier, and the quadrature network including a third capacitive means coupled to a second gyrator, the second gyrator comprising a third amplifier whose output is coupled to a fourth capacitive means and to the input of a fourth amplifier whose output is coupled in a feedback loop to the input of the third amplifier, the arrangement being such that a signal applied at a predetermined frequency to the input of the quadrature network is shifted in phase by 90° at the output of the quadrature network, and each of said first, second, third and fourth amplifiers including means for contolling the transconductance of the amplifier, said controlling means being ganged together whereby to vary the frequency of the oscillator while maintaining a phase shift of 90° from the quadrature network at the oscillator frequency.

3. A network as claimed in claim 2 including a load resistance at the network output comprising a sixth amplifier having an input and output, its output connected to its input in feedback configuration.

4. A network as claimed in claim 2 wherein any of the said amplifiers comprises a pair of bipolar transistors having emitters and collector loads, whose emitters are coupled by a constant current source and whose collector loads are constituted by constant current sources, the transconductance of the amplifier being variable by adjusting the value of operating current of a collector load constant current source.

5. A network as claimed in claim 4 wherein the amplifier has an input, the input to the amplifier includes means for limiting the value of the input signal to a range within which there is a linear relationship between input and output signals of the pair of bipolar transistors.

* * * * *